United States Patent [19]
Kitamura et al.

[11] Patent Number: 5,485,479
[45] Date of Patent: Jan. 16, 1996

[54] SEMICONDUCTOR LASER DEVICE ENCAPSULATED IN A TRANSPARENT RESIN LAYER

[75] Inventors: Shoji Kitamura; Yoichi Shindo, both of Kawasaki, Japan

[73] Assignee: Fuji Electric Co., Ltd., Kanagawa, Japan

[21] Appl. No.: 354,927

[22] Filed: Dec. 13, 1994

Related U.S. Application Data

[63] Continuation-in-part of Ser. No. 43,482, Apr. 6, 1993, Pat. No. 5,444,726, which is a continuation-in-part of Ser. No. 788,601, Nov. 6, 1991, Pat. No. 5,355,385.

[30] Foreign Application Priority Data

| Nov. 7, 1990 | [JP] | Japan | 2-302258 |
| Apr. 7, 1992 | [JP] | Japan | 4-85323 |
| Jan. 22, 1993 | [JP] | Japan | 5-8679 |
| Mar. 30, 1993 | [JP] | Japan | 5-70597 |
| Dec. 14, 1993 | [JP] | Japan | 5-312360 |

[51] Int. Cl.⁶ .............................. H01S 3/025; H01L 33/00
[52] U.S. Cl. ............... 372/43; 372/36; 437/209; 437/219; 257/787
[58] Field of Search ................. 372/36, 43, 50; 437/206, 209, 217, 219, 220; 257/99, 100, 668, 787, 796, 790

[56] References Cited

U.S. PATENT DOCUMENTS

| 4,152,624 | 5/1979 | Knaebel | 313/499 |
| 4,877,756 | 10/1989 | Yamamoto et al. | 437/209 |
| 5,068,866 | 11/1991 | Wada et al. | 372/36 |
| 5,089,861 | 2/1992 | Tanaka et al. | 257/89 |
| 5,140,384 | 8/1992 | Tanaka | 357/17 |
| 5,177,753 | 1/1993 | Tanaka | 372/36 |
| 5,307,362 | 4/1994 | Tanaka et al. | 372/50 |
| 5,309,460 | 5/1994 | Fujimaki et al. | 372/36 |
| 5,367,530 | 11/1994 | Noishiki et al. | 372/43 |

FOREIGN PATENT DOCUMENTS

| 416195A2 | 3/1991 | European Pat. Off. |
| 592746A1 | 4/1994 | European Pat. Off. |
| 4307570A1 | 9/1993 | Germany. |
| 1-166591 | 6/1989 | Japan. |
| 2-125687 | 5/1990 | Japan. |
| 2-125688 | 5/1990 | Japan. |
| 2-159084 | 6/1990 | Japan. |
| 4-137580 | 5/1992 | Japan. |
| 4-320386 | 11/1992 | Japan. |
| 4-346281 | 12/1992 | Japan. |

OTHER PUBLICATIONS

Patent Abstract of Japan, vol. 17, No. 238 (E–1363) relating to Japanese Patent document 4–364791, published Dec. 17, 1991, Abstract published May 13, 1993.

Primary Examiner—Rodney B. Bovernick
Assistant Examiner—Hemang Sanghavi
Attorney, Agent, or Firm—Finnegan, Henderson, Farabow, Garrett & Dunner

[57] ABSTRACT

A semiconductor laser includes a sealing resin portion with a flat portion covering a main portion of an LD element and a flange portion integrally molded with the flat portion and covering connecting leads on their terminal side. The top and bottom surfaces as well as the side faces of the flat portion are arranged symmetrically with respect to the center of the the connecting leads. The outer periphery of the flange portion has a curvature of a virtual cilcle which has a center of the laser beam emitting point of the LD chip. The virtual circle is determined to have the curvature so that the flange portion can be mounted onto an optical apparatus. The symmetrical arrangement of the flat portion suppresses displacement of the laser beam emitting point caused by thermal stress and the flange portion facilitate mounting of the semiconductor laser device in the same way as the conventional can-type semiconductor laser device.

1 Claim, 8 Drawing Sheets

SEMICONDUCTOR LASER DEVICE ENCAPSULATED IN A TRANSPARENT RESIN LAYER

This is a continuation-in-part of application Ser. No. 08/043,482, filed on Apr. 6, 1993, and issued Aug. 22, 1995 under U.S. Pat. No. 5,444,726 which is a continuation-in-part of application Ser. No. 07/788,601, filed on Nov. 6, 1991 and issued on Oct. 11, 1994 under U.S. Pat. No. 5,355,385.

BACKGROUND OF THE INVENTION

The present invention relates to a semiconductor laser device, and more specifically, the present invention relates to a shape of a sealing resin layer for sealing a laser diode (hereinafter simply referred to as an LD) element of the semiconductor laser device.

Semiconductor laser devices are used in various optical devices and apparatuses including optical disks such as compact disks (hereinafter simply referred to as CD), laser beam printers, etc.

As the semiconductor laser devices, a can-type semiconductor laser device is well-known. FIGS. 5(a) and 5(b) schematically illustrat a configuration and mounting state of the can-type semiconductor laser device. As shown in the partly perspective view of FIG. 5(a), an LD element comprising an LD chip 1 and a sub-mount layer 2 as a heat radiator plate, is soldered to a radiator block 4 protruding upward from a stem 3. A cap 6 having a glass window 5 on its top, for covering and for protecting the LD chip 1, is soldered to the stem 3. Figure 5(b) is a sectional view showing installation of the semiconductor laser device on a part 7 of an optical apparatus. A trench 8 is provided between the cap 6 and the part 7 of the apparatus. In FIG. 5(b), a laser beam 9 is emitted in a direction indicated by an arrow.

FIG. 6(a) is a front plan view of the can-type laser diode device and FIG. 6(b) is a sectional view taken along A—A of FIG. 6(a). In FIGS. 6(a) and 6(b), the same parts with those in FIGS. 5(a) and 5(b) are designated by the same reference numerals. As shown in FIG. 6(a), the laser beam emitting point of the laser diode device should be kept at a predetermined point. The LD chip 1 is arranged so that its laser beam emitting point is positioned at a cross point 10 of a central axis of the stem 3 and the glass window 5, X-axis vertical to a major surface of the radiator body 4, and Y-axis parallel to the major surface of the radiator body 4. Also, arrangement of the sub-mount 2 and the radiator body 4 is determined. As shown in FIG. 5(b), the semiconductor laser device is installed on the apparatus usually by inserting the cap 6 into the trench 8 and by adhesion or pressurized-bonding of a flange portion 3a of the stem 3 to the apparatus. The location of the laser beam emitting point is defined by the outer periphery and upper face of the flange portion 3a. The shape and dimensions of the semiconductor laser device including the flange portion 3a have been standardized so as to avoid changes of design and parts of the apparatuses into which the semiconductor laser device is incorporated. For example, an outer diameter of the most popular semiconductor laser device with low output power of 3 to 5 mW for CDs is specified at 5.6 mm, and an outer diameter of a high output power semiconductor laser device is specified at 9 mm.

A semiconductor laser device to be developed should be one which can be handled in the same way as the conventional semiconductor laser devices for avoiding the aforementioned changes of design and parts of the apparatuses. That is, the new semiconductor laser device should be the same as the conventional one in its installation mechanism and location of the laser beam emitting point. In addition, the new semiconductor laser device should be cheaper than the conventional one. Recently, a resin-sealed-type (mold-type) semiconductor laser device has been developed which is cheaper than the conventional can-type semiconductor laser device. The mold-type semiconductor laser device has more freedom in designing its shape and dimensions than the can-type one.

FIG. 7 is a perspective view showing the aforementioned mold-type semiconductor laser device disclosed in Japanese Laid Open Patent Publication No. Hei. 2-125687 and in Japanese Laid Open Patent Publication No. Hei. 2-125688. In FIG. 7, the mold-type semiconductor laser device comprises an LD chip 1 mounted on a sub-mount layer 2, and a cylindrical sealing resin layer 11, made, for example, of transparent epoxy resin, surrounding the LD chip 1 and the sub-mount layer 2. The sealing resin layer 11 comprises a cylindrical flange portion 11a corresponding to the flange portion 3a of the stem 3 in the can-type semiconductor laser device. The mold-type semiconductor laser device is driven via connecting leads 12 and gold wires 13. A resin-mold-type device has been applied to the light sources with low beam density per unit area such as light emitting diodes (LEDs).

FIG. 8 is a schematic sectional view showing the structure of the LD chip 1. In FIG. 8, the LD chip 1 has a double hetero (DH) structure which comprises an n-type GaAs substrate 14, an n-type AlGaAs clad layer 15, a GaAs active layer 16, a p-type clad layer 17, and a p-type cap layer 18. A top surface of the p-type cap layer 18 (major face of the LD chip) is covered with an electrode 19 and the bottom surface of the GaAs substrate 14 is covered with a back electrode 20.

FIG. 9 is a sectional view of the LD chip 1 taken along A—A of FIG. 8. In FIG. 9, the same parts as those in FIG. 8 are designated by the same reference numerals. As shown in FIG. 9, the LD chip 1 is further comprised of protective layers 22 formed on end faces 21 from which the laser beam 9 is emitted. The protective layers 22 are formed for preventing the end faces 21 from breakdown. The protective layer 22 is made, for example, of silicone which shows a low optical absorption coefficient in the wavelength range of the laser beam 9 and high thermal endurance. The protective layers 22 prevent the properties of the semiconductor laser from deterioration caused by optical damage of the sealing resin layer 11. The protective layers 22 provided between the end faces 21 of the LD chip 1 and the sealing resin layer 11, attenuate laser beam density in the sealing resin layer 11 and prevent the sealing epoxy layer 11 from being optically damaged by the laser beam 9.

The resin-mold-type devices described above are well suited for cost reduction and enlarging design freedom. The resin-mold-type device is applicable also to laser diodes with high beam density. The resin-mold-type semiconductor laser device as shown in FIG. 7, which has the same shape with that of the conventional can-type semiconductor laser device, is well suited for installing on the optical apparatuses.

FIGS. 10(a) and 10(b) show a main portion of the resin-mold-type semiconductor laser device of FIG. 7, in which FIG. 10(a) is a front plan view and FIG. 10(b) is a sectional view taken along A—A of FIG. 10(a). In FIGS. 10(a) and 10(b), the same parts as those in FIG. 7 are designated by the same reference numerals. In FIG. 10(a), the LD chip 1 is positioned in the center of the sealing resin layer 11 at a cross point 10 of X-axis (perpendicular to the major face of the LD chip 1) and Y-axis (parallel to the major face of the LD chip 1) similarly as in the can-type semiconductor laser device (see FIG. 6(a)). A center 23 of the connecting leads 12 is displaced by an offset distance $\Delta X_{off}$ inevitably determined by the position of the LD chip 1, the thickness of the sub-mount layer 2 and the thickness of the connecting lead 12. Explanations with reference to FIG. 10(b) will be omitted for avoiding duplication.

The structure of the semiconductor laser device shown in FIGS. 10(a) and 10(b) accompanies two major problems described below.

(1) The laser beam emitting point displaces by temperature rise of the resin around the LD chip 1 caused by power supply to the LD chip 1 or by temperature rise of the environment.

(2) The sealing resin layer 11 peals off from the protective layer 22. This pealing-off causes deterioration of beam radiation characteristics (far field pattern characteristics: FFP characteristics).

Now, the problem (1) will be explained more in detail. FIG. 11 shows an example of displacement of the laser beam emitting point. FIG. 11 is a graph showing the relation between the displacement of the laser beam emitting point along X-direction shown in FIG. 10(a) and the operation time of the semiconductor laser device. In FIG. 11, a single-dotted chain line represents the displacement in the cylindrical resin-mold-type semiconductor laser device and a solid line represents the displacement in a flat resin-mold-type semiconductor laser device described later.

As FIG. 11 shows, an emitting point of the laser beam is displaced along X-direction when the semiconductor laser device of FIG. 10(a) is driven with a current of 50 mA at a room temperature. As shown in FIG. 11, the laser beam emitting point is displaced by 0.5 μm in −X-direction (+X is taken on the side of the LD chip 1 and −X on the side of the connecting leads 12) in 2 min after the laser diode is turned on and returns to the original position in 2 min after the laser diode is turned off. When this semiconductor laser device is incorporated, for example, into an optical pickup for CDs, trouble is caused in the CD device immediately after the semiconductor laser is turned on or by temperature change of the environment.

It has been found that the displacement of the laser beam emitting point is caused by the displacement of the connecting leads 12 in X-direction by thermal expansion of the sealing resin layer 11 which is caused by heat generated from the LD chip 1 or temperature change of the environment. This displacement of the connecting leads 12 by thermal expansion of the sealing resin layer is closely related to the offset 24 of $\Delta X_{off}$ of the connecting leads 12 from the center 10 of the sealing resin layer 11 shown in FIG. 10(a). However, the offset $\Delta X_{off}$ affects the displacement of the laser beam emitting point via the thermal expansion of the sealing resin layer near the LD chip 1. The sealing resin layer away from the LD chip 1, for example, the flange portion 11a of FIG. 10(a) does not cause the displacement of the laser beam emitting point.

It is necessary, for avoiding the displacement of the laser beam emitting point, to form the sealing resin layer 11 so that the connecting leads 12 are positioned at the center of symmetry of the sealing resin layer 11. If one considers a cross section of a central connecting lead parallel to the front laser beam emitting face of the LD chip 1, it is enough to form the sealing resin layer 11 symmetrically in volume at least nearby the main portion of the LD chip 1 with respect to a center line (parallel to Y-axis) of the central connecting lead 12. That is, it is necessary to form the sealing resin layer 11 so that the center 10 of the sealing resin layer 11 may coincide with the center 23 of the central connecting lead 12, though it is not always necessary to form the sealing resin layer 11 symmetrically in its portions away from the LD chip 1 or the connecting leads 12.

The pealing-off problem of (2) is practically solved by forming the sealing resin layer 11 symmetrical with respect to the connecting leads 12 as described above and in a thin flat plate.

FIG. 12 is a schematic perspective view showing a flat resin-mold-type semiconductor laser device disclosed in Japanese Laid Open Patent Publication No. Hei. 2-125687. This semiconductor laser device facilitates relieving stress caused by thermal expansion of the resin by reducing the volume of the resin which covers around the protective layer 22 and by equalizing the sealant resin volume around the LD chip 1.

Table 1 shows comparison results of electrical and optical properties measured at predetermined cycles in a heat cycle test conducted on a test specimen of a cylindrical resin-mold-type semiconductor laser device as shown in FIG. 7 and a test specimen of a thin flat resin-mold-type semiconductor laser device as shown in FIG. 12. In both sample semiconductor laser devices, the protective layers 22 were made of gummy organosilicon resin containing dimethylsiloxane as its main component. The heat cycle test repeated one heat cycle consisted of heating at 85° C. for 30 min, rapid cooling down to −40° C., and keeping at −40° C. for 30 min followed by return to 85° C.

TABLE 1

| Specimen No. | Shape of sealing resin layer | Content of fault | Numbers of heat cycle | | | |
|---|---|---|---|---|---|---|
| | | | 100 | 200 | 300 | 400 |
| 1 | Cylindrical | FFP deterioration (%) | 0 | 5 | 8 | 12 |
| | | Fault other than FFP deterioration (%) | 0 | 0 | 0 | 0 |
| 2 | Flat | FEP deterioration (%) | 0 | 0 | 0 | 0 |
| | | Fault other than FEP deterioration (%) | 0 | 0 | 0 | 0 |

As is apparent from Table 1, the far field pattern (FFP) of the laser beam from the cylindrical resin-mold-type semiconductor laser device of FIG. 7 deteriorated during the heat cycle test. However, any fault was not observed on the thin flat resin-mold-type semiconductor laser device of FIG. 12. The observed far field pattern (FFP) deterioration was caused by pealing-off between the protective layer 22 and the sealing resin layer 11. Thus, the thin flat resin-mold-type semiconductor laser device prevents pealing-off of the resin layers.

In this thin flat resin-mold-type semiconductor laser device, any displacement of the laser beam emitting point did not occur as shown in FIG. 11.

As described above, the resin-mold-type semiconductor laser device is well suited for cost reduction irrespective of whether its sealing resin layer is cylindrical or thin and fat. Though the cylindrical resin-mold-type semiconductor laser device is easily mounted on an apparatus as the can-type semiconductor laser device through the flange portion formed as a part of the sealing resin layer, the sealing resin layer is bulky and asymmetric with respect to the center line of the connecting lead. This asymmetry generates stress by temperature change and causes FFP deterioration by displacement of the laser beam emitting point. The thin flat resin-mold-type semiconductor laser device, the sealing resin layer of which is small in volume and symmetric with respect to the center line of the connecting lead, solves the problem described above. However the conventional thin flat resin-mold-type semiconductor laser device is not mounted on an apparatus in the same way as the can-type semiconductor laser device, since the conventional thin flat resin-mold-type semiconductor laser device lacks the flange portion. Thus, the cylindrical and the thin flat resin-mold-type semiconductor laser devices accompany the problems which are incompatible with each other.

SUMMARY OF THE INVENTION

In view of the foregoing, an object of the present invention is to provide a resin-mold-type semiconductor laser device which is easily mounted as the can-type semiconductor laser device on an optical apparatus and eliminates displacement of a laser beam emitting point and pealing-off of resin layers.

The object of the present invention is achieved by a semiconductor laser device which comprises a laser diode chip, connected with connecting means (connecting leads) through a sub-mount layer, for emitting a laser beam; and a sealing resin layer transparent for the laser beam for tightly covering the connecting means and at least a main portion of the laser diode chip, in which the sealing resin layer is comprised of a flat portion covering at least the main portion of the laser diode chip; and at least one flange portion integrated with the flat resin portion and covering a terminal portion of the connecting means at which the connecting means is connected with an apparatus into which the semiconductor laser device is incorporated. The flat portion is comprised of top and bottom surfaces arranged symmetrically with respect to a horizontal axis which crosses a center of the connecting means (alignment of the connecting leads) defined by a position of the laser diode chip and side faces arranged symmetrically with respect to a vertical axis which crosses the center of the connecting means. At least one flange portion is comprised of a peripheral surface, the center of curvature of which coincides with a laser beam emitting point of the laser diode chip.

In the semiconductor laser device according to the present invention, the flat portion of the sealing resin layer is formed in such a way that, at least around the main portion of the LD chip, its top and bottom surfaces are symmetrically arranged with respect to a horizontal center line of the connecting means (parallel to the alignment of the connecting leads) and both side faces are symmetrically arranged with respect to a vertical center line of the connecting means (perpendicular to the alignment of the connecting leads). Therefore, this configuration of the flat portion suppresses generation of stress caused by thermal expansion difference between the sealant resin and the connecting leads and prevents the laser beam emitting point from displacing. In addition to this, the outer peripheral surface of the flange portion of the sealing resin layer has a center of curvature which coincides with the laser beam emitting point of the LD chip. Since the curvature of the outer peripheral surface can be set at the curvature of the flange portion of the can-type semiconductor laser device, the configuration of the flange portion facilitates incorporating the semiconductor laser device of the present invention into apparatuses in which the semiconductor laser device is used.

DETAILED DESCRIPTION OF THE PREFERRED EMBODIMENTS

Now the present invention will be described in detail hereinafter with reference to the accompanied drawings which illustrate preferred embodiments of the present invention.

Figure 1A:
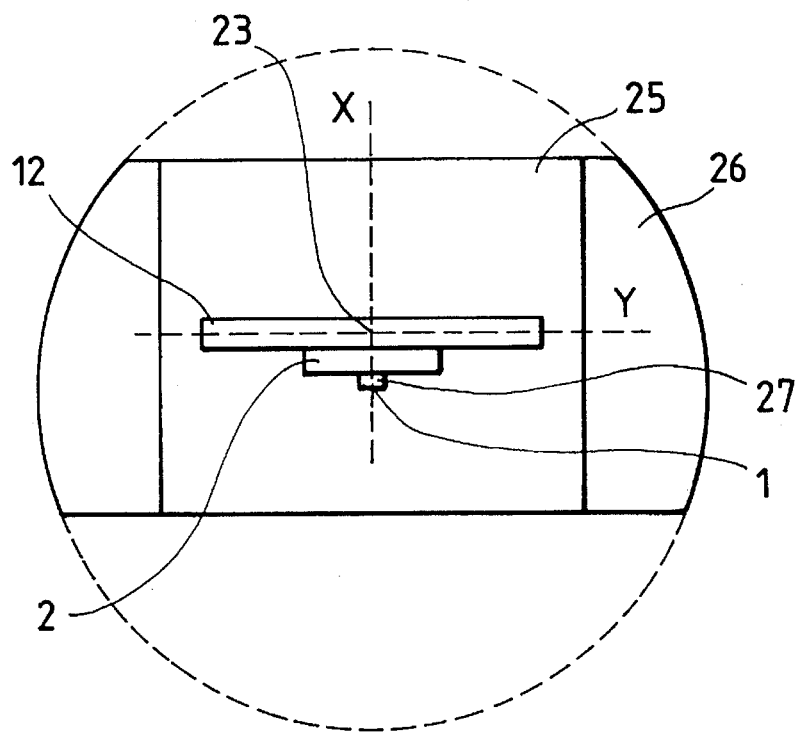
FIG. 1(a) is a front plan view schematically showing a structure of a main portion of a semiconductor laser device according to the present invention.
Figure 1B:
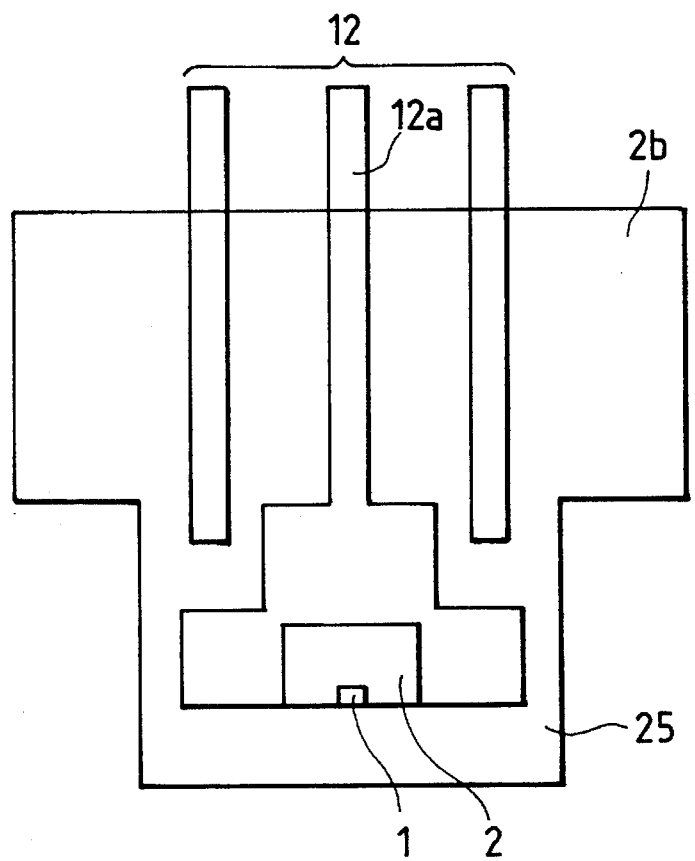
FIG. 1(b) is a top plan view of the main portion of the semiconductor laser device of FIG. 1(a)

FIG. 1(a) is a front plan view schematically showing a structure of a main portion of the semiconductor laser device according to the present invention and FIG. 1(b) is a top plan view thereof. The same parts as those in the figures already explained are designated by the same reference numerals.

The semiconductor laser device comprises an LD chip 1, the end faces of which are covered with not shown protective layers, connected to connecting means (connecting leads) 12 through a sub-mount layer 2. In FIG. 1(*b*), the connecting means 12 is comprised of three connecting leads aligned in a plane (lead plane). A central connecting lead 12*a* is longer than the other two and its top portion is expanded sidewise over the other two connecting leads in the lead plane. The LD chip 1 is mounted on the sub-mount layer 2 which is disposed on the expanded top portion of the central connecting lead 12*a*. A sealing layer of transparent epoxy resin (sealing resin layer) is comprised of a flat portion 25 and two semicylindrical flange portions 26 integrally molded with the flat portion 25. The flat portion 25 covers at least a main portion of an LD element including the LD chip 1. The semicylindrical flange portions 26 protrude sidewise from the flat portion 25 and cover the area around terminal ends of the connecting means 12 (terminal portion of the connecting means 12 at which the connecting means 12 is connected with an apparatus into which the semiconductor laser device is incorporated). The peripheral surfaces of the semicylindrical flange portions 26 have a predetermined radius of curvature.

Figure 12:
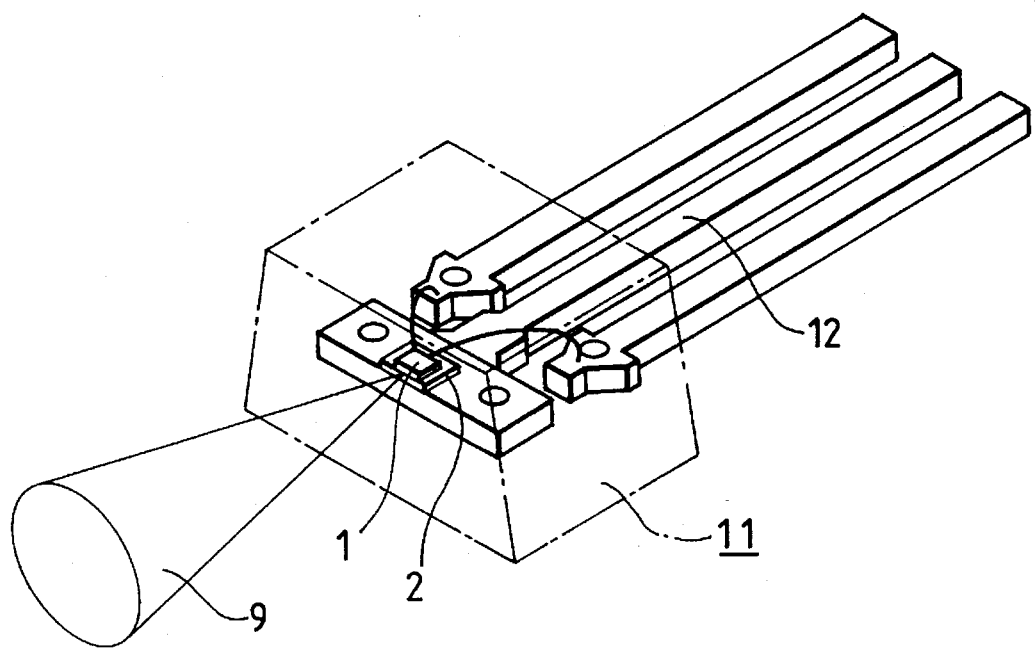
FIG. 12 is a perspective view schematically showing the conventional flat resin-mold-type semiconductor laser device.

The flat portion 25 of the sealing resin layer of the present invention corresponds in its main structure to the sealing resin layer 11 of FIG. 12. The center of the flat portion 25 coincides with the center 23 of the top portion of the central connecting lead 12*a*. The top and bottom surfaces of the flat portion 25 are arranged in symmetrical locations in width direction (Y-direction) with respect to the center 23, and the side faces of the flat portion 25 are arranged in symmetrical locations in thickness direction (X-direction) with respect to the center 23. By this arrangement, stress generation caused by thermal expansion difference between the sealant resin and the connecting leads 12 is suppressed.

Figure 7:
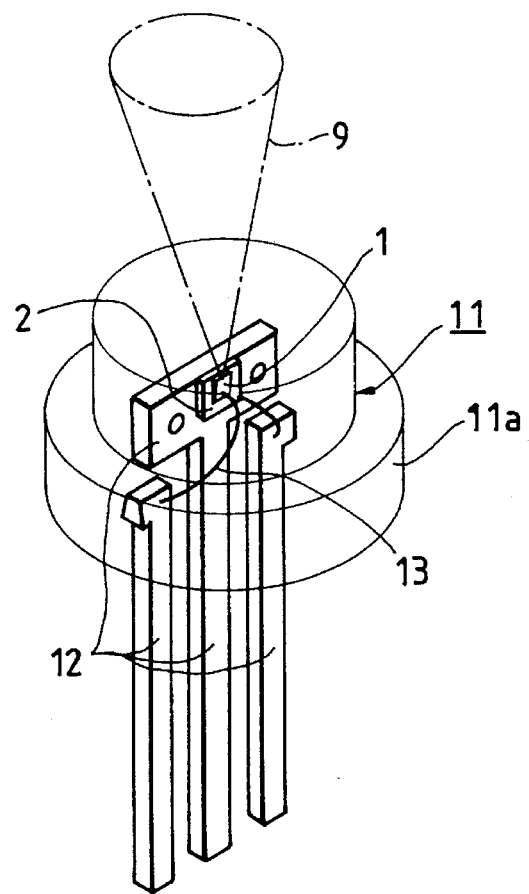
FIG. 7 is a perspective view showing a conventional resin-mold-type semiconductor laser device.
Figure 8:
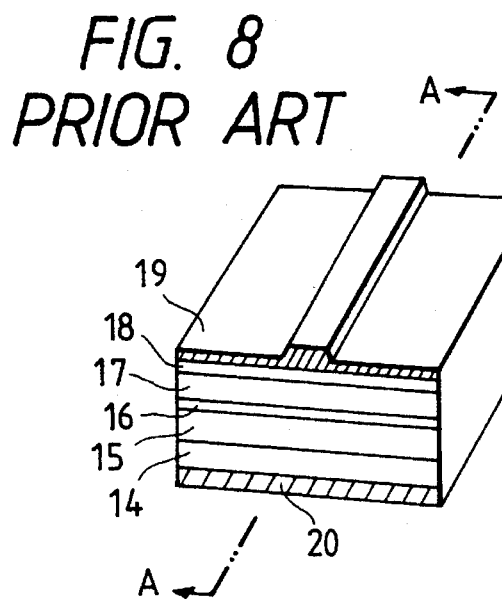
FIG. 8 is a sectional view schematically showing the structure of an LD chip.
Figure 9:
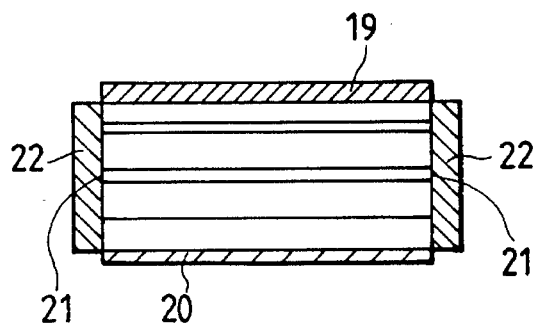
FIG. 9 is a sectional view of the LD chip taken along A—A of FIG. 8.
Figure 10A:
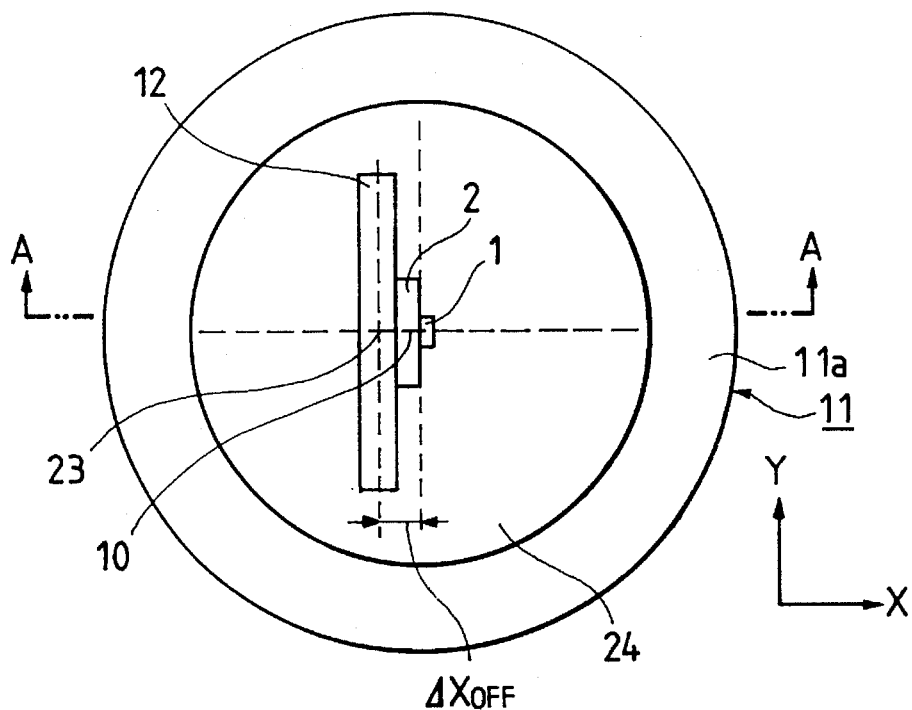
FIG. 10(a) is a front plan view showing a main portion of the resin-mold-type semiconductor laser device of FIG. 7.
Figure 10B:
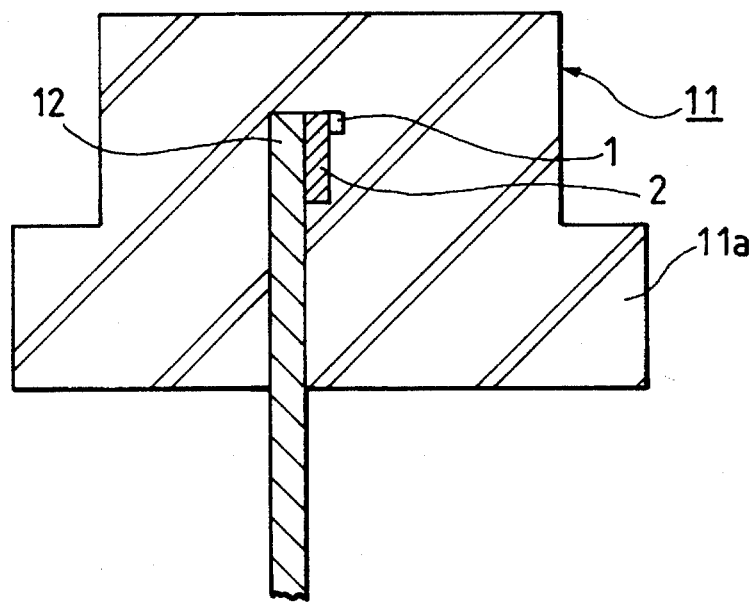
FIG. 10(b) is a sectional view taken along A—A of FIG.
Figure 11:
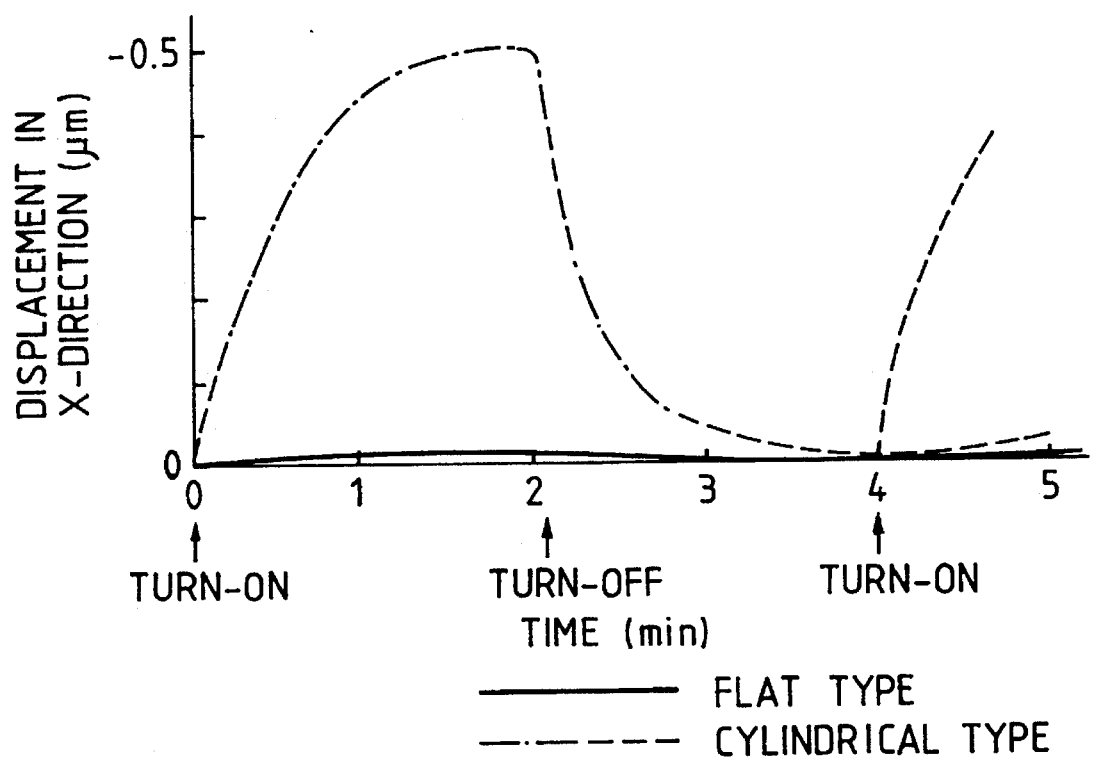
FIG. 11 is a graph showing the relation between the displacement of the laser beam emitting point along X-direction and the operation time of the semiconductor laser devices.

The configuration of the flange portion 26 almost coincides with the flange portion 11*a* of the sealing resin portion 11 of FIGS. 7 and 10. The center of curvature of the outer periphery of the flange portion 26 coincides with the laser beam emitting point 27 of the LD chip 1 and the outer periphery of the flange portion 26 inscribes in a virtual circle having the center of the beam emitting point 27 and represented by a broken line. The radius of curvature of this virtual circle, i.e. the radius of curvature of the flange portion 26, is determined so that the flange portion 26 facilitates mounting of the resin-mold-type semiconductor laser device on an optical apparatus in a same manner as the can-type semiconductor laser device.

Figure 2:
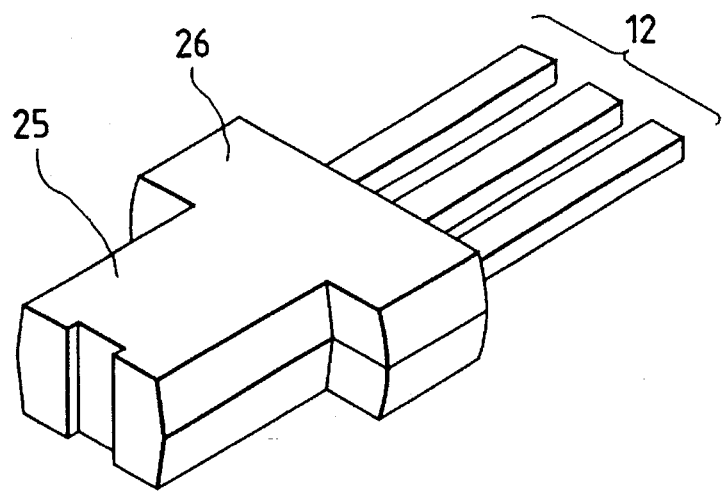
FIG. 2 is a squint-eyed view schematically showing a typical external appearance of a resin-mold-type semiconductor laser device according to the present invention.
Figure 3A:
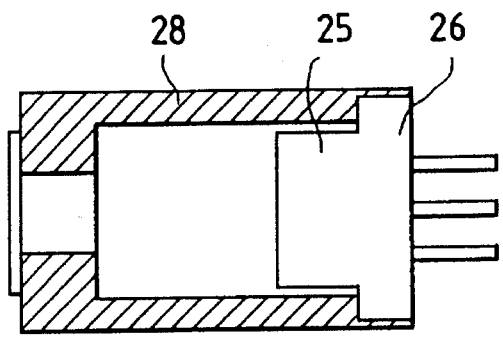
FIG. 3(a) is a sectional view of a cylindrical laser guide of an optical pickup for CDs on which the resin-mold-type semiconductor laser device of the present invention is mounted.
Figure 3B:
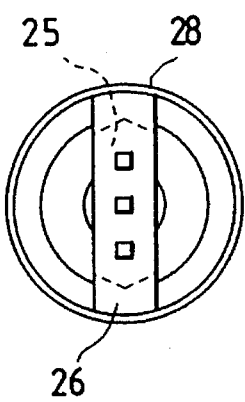
FIG. 3(b) is a plan view of the cylindrical laser guide seen from the top side of the mounted resin-mold-type semiconductor laser device.
Figure 3C:
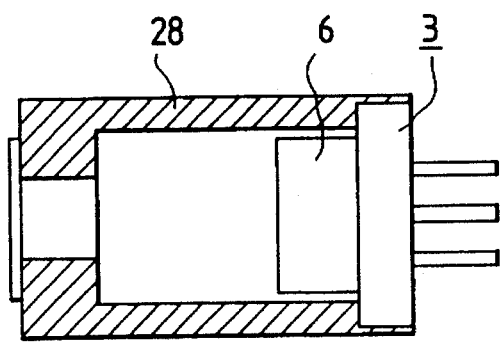
FIG. 3(c) is a sectional view of the cylindrical laser guide on which a conventional can-type semiconductor laser device is mounted.
Figure 3D:
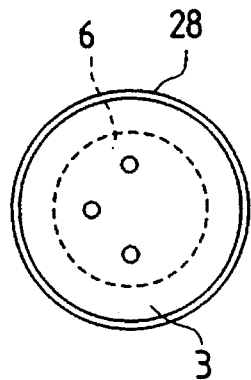
FIG. 3(d) is a plan view of the cylindrical laser guide seen from the top side of the mounted can-type semiconductor laser device.

FIG. 2 is a squint-eyed view schematically showing a typical external appearance of the resin-mold-type semiconductor laser device according to the present invention. According to the present invetion, the resin-mold-type semiconductor laser device exhibits such a shape.

FIGS. 3(*a*) to 3(*d*) include sectional views and plan views of a cylindrical laser guide 28 of an optical pickup for CDs on which the resin-mold-type semiconductor laser device of the present invention is mounted and also on which the conventional can-type semiconductor laser device is mounted for comparison. FIG. 3(*a*) is a sectional view of the cylindrical laser guide 28 of an optical pickup for CDs on which the resin-mold-type semiconductor laser device of the present invention is mounted; FIG. 3(*b*) is a plan view of the cylindrical laser guide 28 seen from the top side of the mounted resin-mold-type semiconductor laser device; FIG. 3(*c*) is a sectional view of the cylindrical laser guide 28 on which the conventional can-type semiconductor laser device is mounted; and FIG. 3(*d*) is a plan view of the cylindrical laser guide 28 seen from the top side of the mounted can-type semiconductor laser device. Throughout these figures, the same parts with those already described are designated by the same reference numerals. As have been described already, since the sealing resin layer of the resin-mold-type semiconductor laser device of the present invention is characterized by the flat portion 25, the center of which coincides with the center 23 of the connecting leads 12, and a flange portion or flange portions 26, the center of which coincides with the laser beam emitting point 27 of the LD chip 1, the resin-mold-type semiconductor laser of the present invention can be fixed to the laser guide 28 by means of the flange portion or flange portions 26 in the same way as the conventional can-type semiconductor laser device. And, as have been described already, the flat portion of the sealing resin portion expels the problem pertinent to the sealing resin layer.

Though the mounting of the present resin-mold-type semiconductor laser on the laser guide for CDs was explained as an example, it is obvious that the present resin-mold-type semiconductor laser device can be mounted on any apparatus on which the conventional can-type semiconductor laser device has been mounted. And, the external shape of the resin-mold-type semiconductor laser device of the present invention is not limited to that illustrated in FIG. 2 and can be modified in various ways as needed.

Figure 4A:
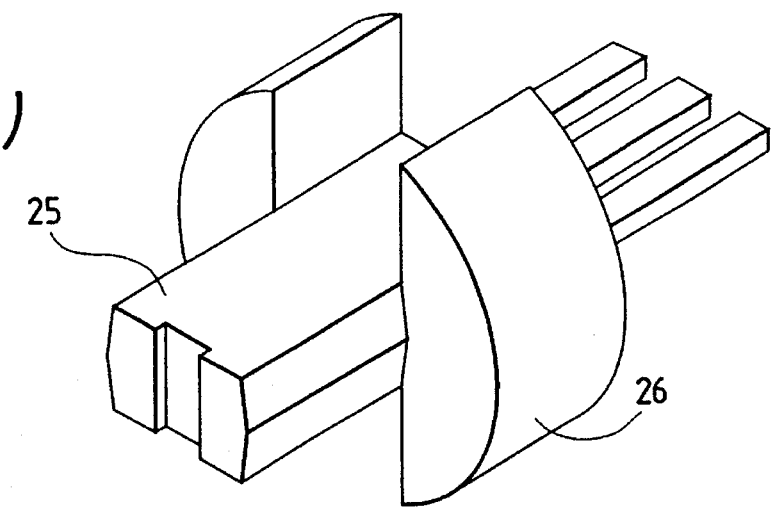
FIGS. 4(a), 4(b) and 4(c) are squint-eyed views schematically showing different external appearances of the resin-mold-type semiconductor laser device according to the present invention.
Figure 4B:
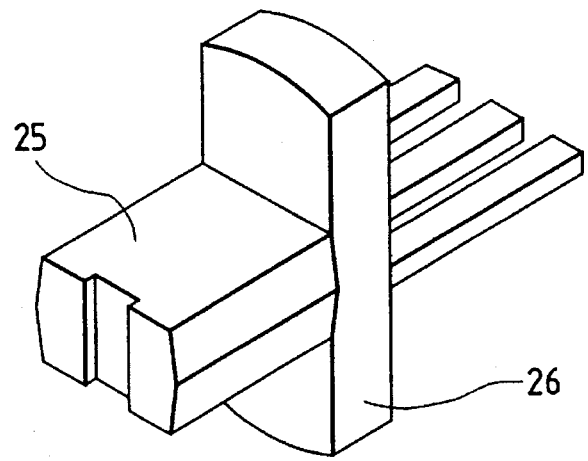
Figure 4C:
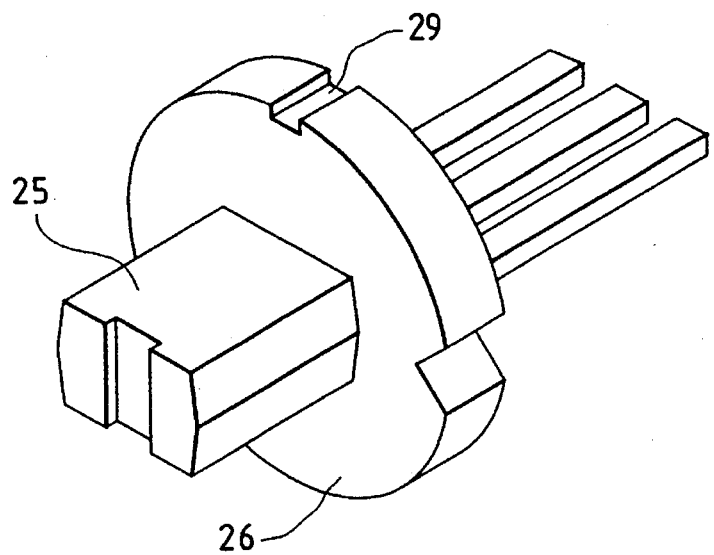
Figure 5A:
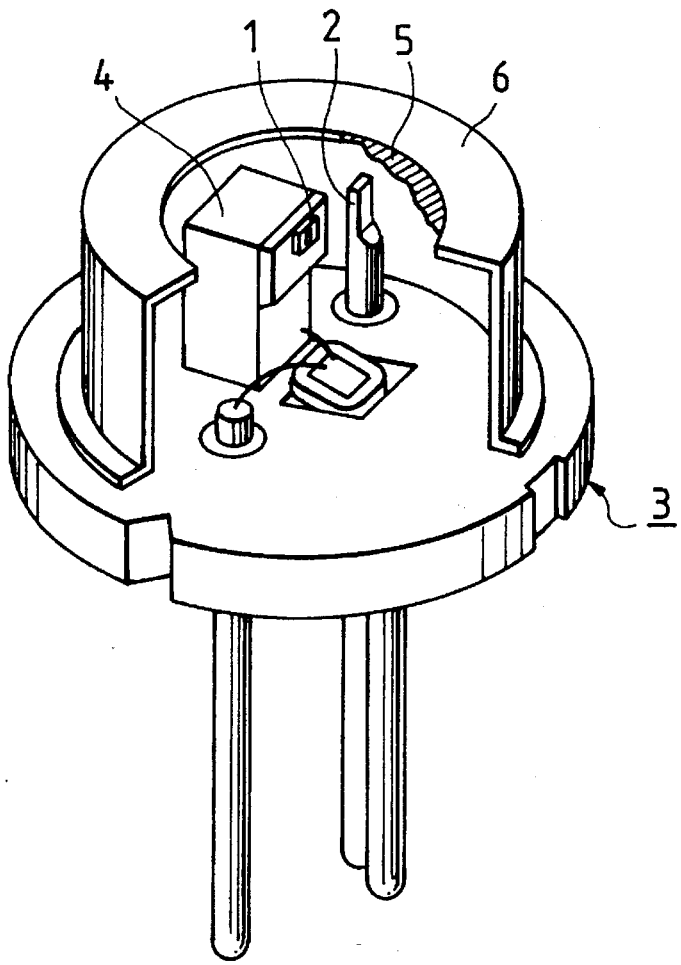
FIG. 5(a) is a perspective view schematically showing a configuration of the conventional can-type semiconductor laser device.
Figure 5B:
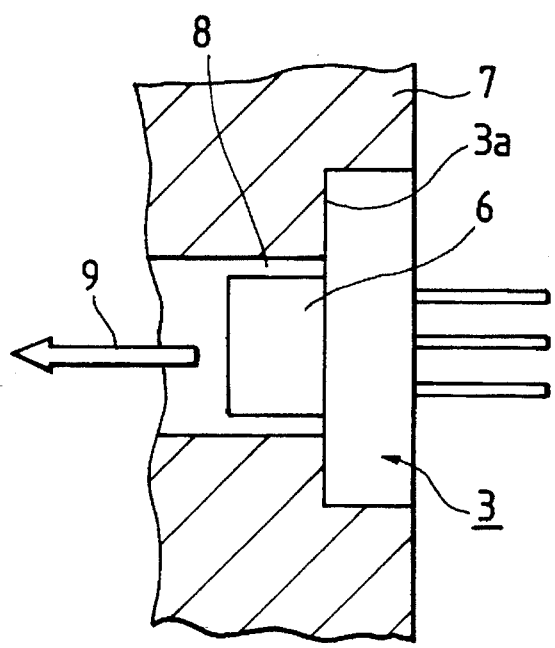
FIG. 5(b) is a sectional view showing the mounting steate of the conventional can-type semiconductor laser device.
Figure 6A:
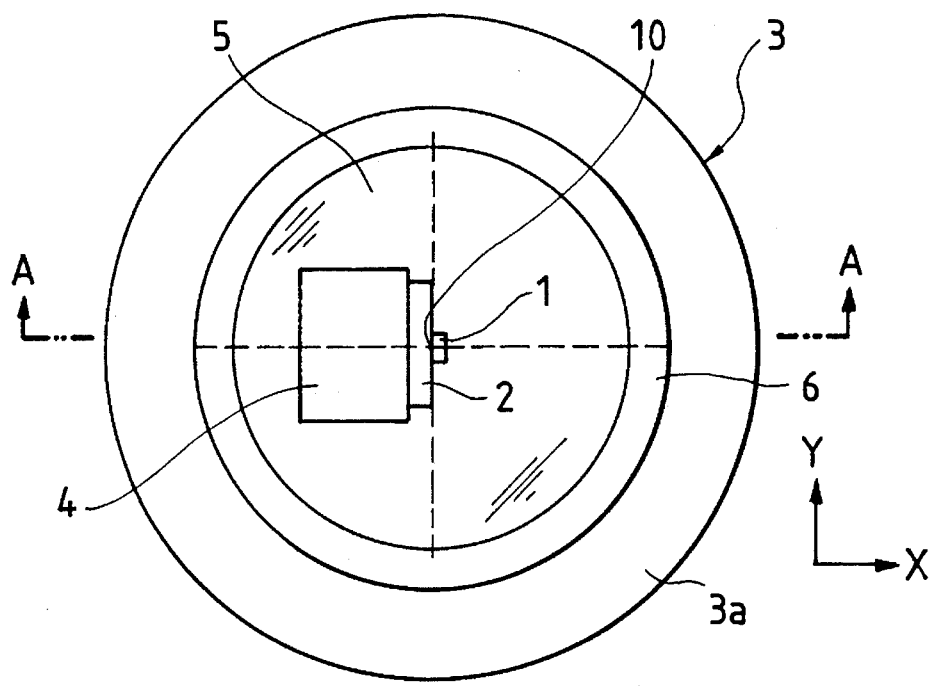
FIG. 6(a) is a front plan view of the can-type laser diode.
Figure 6B:
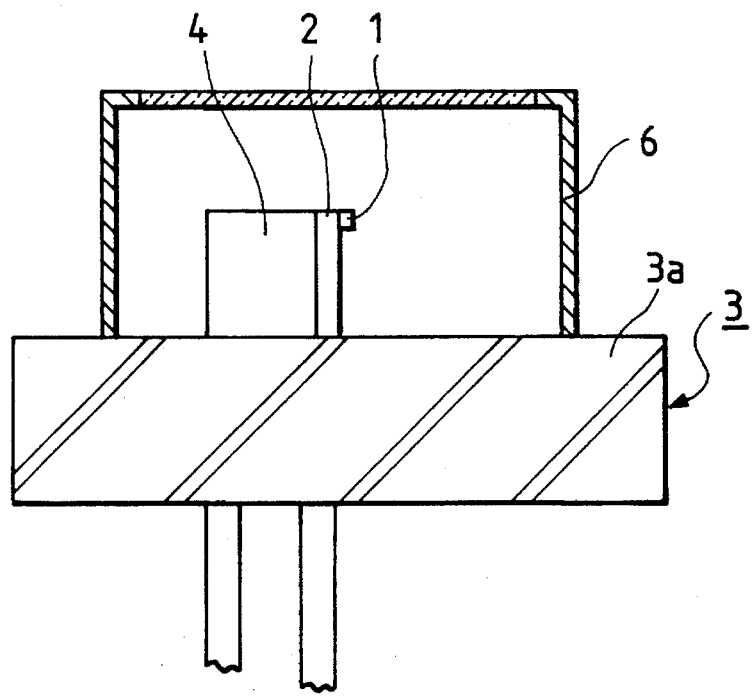
FIG. 6(b) is a sectional view taken along A—A of FIG. (a)

FIGS. 4(*a*), 4(*b*) and 4(*c*) are squint-eyed views schematically showing different external appearances of the resin-mold-type semiconductor laser device according to the present invention. In FIG. 4(*a*), the semicylindrical flange portions 26 are extended upward and downward from those of FIG. 2. In FIG. 4(*b*), the flange portions 26 extend in the thickness direction of the flat portion 25. In FIG. 4(*c*), the resin-moldtype semiconductor laser device has a flat cylindrical flange portion 26 and a groove 29 is formed on the periphery of the flange portion 26 for indicating the position of the LD chip. The resin-mold-type semiconductor laser devices shown in FIGS. 4(*a*), 4(*b*) and 4(*c*) can be used in the same way as the can-type semiconductor laser device. Since the resin-mold-type semiconductor laser device of the present invention is characterized by its symmetry around its LD chip 1 with respect to the connecting leads 12 and by a curved surface or curved surfaces used for mounting the present device on an apparatus, the center of curvature of which coincides with the laser beam emitting point 27 of the LD chip 1, shape and dimensions of the flange portion 26 can be changed so as to meet case by case requirements as far as the aforementioned specific feature is maintained.

As has been explained so far, the resin-mold-type semiconductor laser device of the present invention is comprised of the thin flat portion 25 symmetrical with respect to the connecting leads 12; and the cylindrical flange portion or semicylindrical flange portions integrated with the flat portion 25, each of which comprises an outer peripheral surface, the center of which coincides with the laser beam emitting point of the LD chip. This configuration of the present resin-mold-type semiconductor laser device effectively meets the contradictory requirements to the conventional cylindrical and flat resin-mold-type semiconductor laser devices: the requirements have included suppression of laser beam emitting point displacement and provision of the same mounting mechanism as that of the can-type semiconductor laser device.

Though the conventional cylindrical resin-mold-type semiconductor laser device is easily mounted on an optical apparatus when a flange similar to that of the can-type semiconductor laser device is provided, the sealing resin layer is asymmetrically formed with respect to the connecting leads around the main portion of the LD element. This asymmetry causes asymmetric temperature distribution which further causes thermal stress. And the thermal stress causes displacement of the laser beam emitting point. Though the flat resin-mold-type semiconductor laser device facilitates suppressing thermal stress with its flat sealing resin layer symmetrically formed with respect to the connecting leads, the flat resin-mold-type semiconductor laser device can not be mounted on an optical apparatus in the same way as the can-type semiconductor laser, since the flat resin-mold-type semiconductor laser lacks the same mounting mechanism as that of the can-type semiconductor laser device.

The sealing resin layer of the flat resin-mold-type semiconductor laser device according to the present invention is comprised of the flat portion and the flange portion or flange portions. The flat portion covers the main portion of the LD element and is symmetrically formed with respect to the connecting leads. The flange portion covers the terminal portion at which the semiconductor laser device is fixed to an optical apparatus and is formed in various shape so as to be mounted on the optical apparatus in the same way as the can type semiconductor laser device. The flat portion and the flange portion or flange portions are integrally molded into a sealing resin layer. The integrally molded sealing resin layer facilitates suppressing displacement of the laser beam emitting point and pealing-off of the resin layer, and provides a mounting mechanism which functions in the same way as the flange of the can-type semiconductor laser device. Thus, the flat resin-mold-type semiconductor laser device according to the present invention has solved the problems of the cylindrical and flat resin-mold-type semiconductor laser devices and is expected to widen the application targets of the resin-mold-type semiconductor laser devices.

What is claimed is:

1. A semiconductor laser device, comprising:

a laser diode chip for emitting a laser beam;

a sub-mount layer on which said laser diode chip is disposed;

connecting means to which said laser diode chip is connected through said sub-mount layer; and a sealing resin layer transparent for said laser beam for tightly covering said connecting means and at least a main portion of said laser diode chip;

wherein said sealing resin layer comprises:

a flat portion covering at least said main portion of said laser diode chip, said flat portion including top and bottom surfaces arranged symmetrically with respect to an X-axis which is vertical to a surface of said chip and crosses a center of said connecting means defined by a position of said laser diode chip, and side faces arranged symmetrically with respect to a Y-axis which is parallel to said surface of said chip and crosses said center of said connecting means; and a flange portion integrated with said flat portion and covering a portion near a terminal of said connecting means to be mounted to an apparatus into which said semiconductor laser device is incorporated, said flange portion including a peripheral surface and at least a part of said peripheral surface having a curvature of a virtual circle with a center of a laser beam emitting point of said laser diode chip.

* * * * *